United States Patent
Rim et al.

(10) Patent No.: US 11,824,130 B2
(45) Date of Patent: Nov. 21, 2023

(54) SOLAR CELL HAVING A PLURALITY OF SUB-CELLS COUPLED BY CELL LEVEL INTERCONNECTION

(71) Applicant: SunPower Corporation, San Jose, CA (US)

(72) Inventors: Seung Bum Rim, Palo Alto, CA (US); Hung-Ming Wang, San Jose, CA (US); David Okawa, Redwood City, CA (US); Lewis Abra, San Francisco, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 17/966,649

(22) Filed: Oct. 14, 2022

(65) Prior Publication Data
US 2023/0033252 A1      Feb. 2, 2023

Related U.S. Application Data

(62) Division of application No. 15/396,098, filed on Dec. 30, 2016, now Pat. No. 11,502,213.

(51) Int. Cl.
*H01L 31/0352*      (2006.01)
*H01L 31/05*        (2014.01)
(Continued)

(52) U.S. Cl.
CPC .. *H01L 31/035281* (2013.01); *H01L 31/0465* (2014.12); *H01L 31/0504* (2013.01);
(Continued)

(58) Field of Classification Search
CPC ... H01L 31/02021; H01L 31/022441–022458; H01L 31/047;
(Continued)

(56) References Cited

U.S. PATENT DOCUMENTS

| 5,164,019 A | 11/1992 | Sinton |
| 8,187,907 B1 * | 5/2012 | Newman ......... H01L 31/022425 257/772 |

(Continued)

FOREIGN PATENT DOCUMENTS

| CN | 101228638 A | 7/2008 |
| CN | 102971865 A | 3/2013 |

(Continued)

OTHER PUBLICATIONS

Machine translation of WO2009/112544A2 (Year: 2009).*

(Continued)

*Primary Examiner* — Ryan S Cannon
(74) *Attorney, Agent, or Firm* — Schwabe, Williamson & Wyatt, P.C.

(57) ABSTRACT

Methods of fabricating solar cells having a plurality of sub-cells coupled by cell level interconnection, and the resulting solar cells, are described herein. In an example, a solar cell includes a plurality of sub-cells. Each of the plurality of sub-cells includes a singulated and physically separated semiconductor substrate portion. Each of the plurality of sub-cells includes an on-sub-cell metallization structure interconnecting emitter regions of the sub-cell. An inter-sub-cell metallization structure couples adjacent ones of the plurality of sub-cells. The inter-sub-cell metallization structure is different in composition from the on-sub-cell metallization structure.

4 Claims, 8 Drawing Sheets

(51) Int. Cl.
  *H01L 31/18* (2006.01)
  *H01L 31/0465* (2014.01)
(52) U.S. Cl.
  CPC ...... *H01L 31/0512* (2013.01); *H01L 31/1804* (2013.01); *Y02E 10/547* (2013.01); *Y02P 70/50* (2015.11)
(58) Field of Classification Search
  CPC ............... H01L 31/0475; H01L 31/044; H01L 31/0443; H01L 31/05–0516; H01L 31/02245; H01L 31/00–99; H01L 31/046–0465; H01L 31/1876–188; H01L 31/1892–1896
  See application file for complete search history.

(56) References Cited

U.S. PATENT DOCUMENTS

| | | | |
|---|---|---|---|
| 9,496,437 | B2 | 11/2016 | Harley et al. |
| 2010/0018565 | A1 | 1/2010 | Funakoshi |
| 2010/0031994 | A1* | 2/2010 | Varghese ............... H01L 31/078 438/66 |
| 2011/0132426 | A1 | 6/2011 | Kang et al. |
| 2013/0139871 | A1 | 6/2013 | Hirata et al. |
| 2014/0020754 | A1 | 1/2014 | Arimoto et al. |
| 2014/0124014 | A1 | 5/2014 | Morad et al. |
| 2014/0196768 | A1* | 7/2014 | Heng ................... H01L 31/0504 136/251 |
| 2014/0209149 | A1 | 7/2014 | Mascarenhas et al. |
| 2014/0261670 | A1 | 9/2014 | Zhu |
| 2014/0370650 | A1 | 12/2014 | Moslehi et al. |
| 2015/0059831 | A1 | 3/2015 | Fukumochi et al. |
| 2015/0090314 | A1 | 4/2015 | Yang et al. |
| 2015/0349173 | A1* | 12/2015 | Morad .................... H01L 31/18 438/98 |
| 2015/0349175 | A1 | 12/2015 | Morad et al. |
| 2016/0233352 | A1 | 8/2016 | Yang et al. |
| 2016/0240705 | A1 | 8/2016 | Takahama |
| 2016/0322526 | A1 | 11/2016 | Kuhn et al. |
| 2017/0162724 | A1 | 6/2017 | Okandan et al. |

FOREIGN PATENT DOCUMENTS

| | | | | |
|---|---|---|---|---|
| DE | 102008021355 | A1 | 10/2009 | |
| JP | 62112381 | A | 5/1987 | |
| JP | 09148601 | A | 6/1997 | |
| WO | 2009112544 | A2 | 9/2009 | |
| WO | WO-2009112544 | A2 * | 9/2009 | ....... H01L 31/02245 |

OTHER PUBLICATIONS

Office Action from German Patent Application No. 10 2017 223 897.6 dated Nov. 8, 2021, 4 pgs.
First Office Action from Chinese Patent Application No. 201711475598.X dated Jul. 5, 2022, 23 pgs.
Notice of Provisional Rejections from Korean Patent Application No. 10-2018-0000186 dated Aug. 21, 2022, 8 pgs.
First Action Interview Office Action Summary from U.S. Appl. No. 15/396,098 dated Jun. 21, 2018, 9 pgs.
First Action Interview Pre-Interview Communication from U.S. Appl. No. 15/396,098 dated Mar. 7, 2018, 8 pgs.
Final Office Action from U.S. Appl. No. 15/396,098 dated Mar. 20, 2019, 20 pgs.
Final Office Action from U.S. Appl. No. 15/396,098 dated Feb. 24, 2020, 19 pgs.
Final Office Action from U.S. Appl. No. 15/396,098 dated Aug. 9, 2021, 18 pgs.
Non-Final Office Action from U.S. Appl. No. 15/396,098 dated Oct. 29, 2019, 15 pgs.
Non-Final Office Action from U.S. Appl. No. 15/396,098 dated Jan. 14, 2022, 18 pgs.
Non-Final Office Action from U.S. Appl. No. 15/396,098 dated Feb. 25, 2021, 22 pgs.
Definition of "solder" [retrieved from at https://www.collinsdictionary.com/dictionary/english/solder on Mar. 15, 2019].

* cited by examiner ions of the present disclosure are in the field of renewable energy and, in particular, methods of fabricating solar cells having a plurality of sub-cells coupled by cell level interconnection, and the resulting solar cells.

SOLAR CELL HAVING A PLURALITY OF SUB-CELLS COUPLED BY CELL LEVEL INTERCONNECTION

CROSS-REFERENCE TO RELATED APPLICATIONS

This application is a divisional of U.S. patent application Ser. No. 15/396,098, filed on Dec. 30, 2016, the entire contents of which are hereby incorporated by reference herein.

TECHNICAL FIELD

Embodiments of the present disclosure are in the field of renewable energy and, in particular, methods of fabricating solar cells having a plurality of sub-cells coupled by cell level interconnection, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

Figure 1:
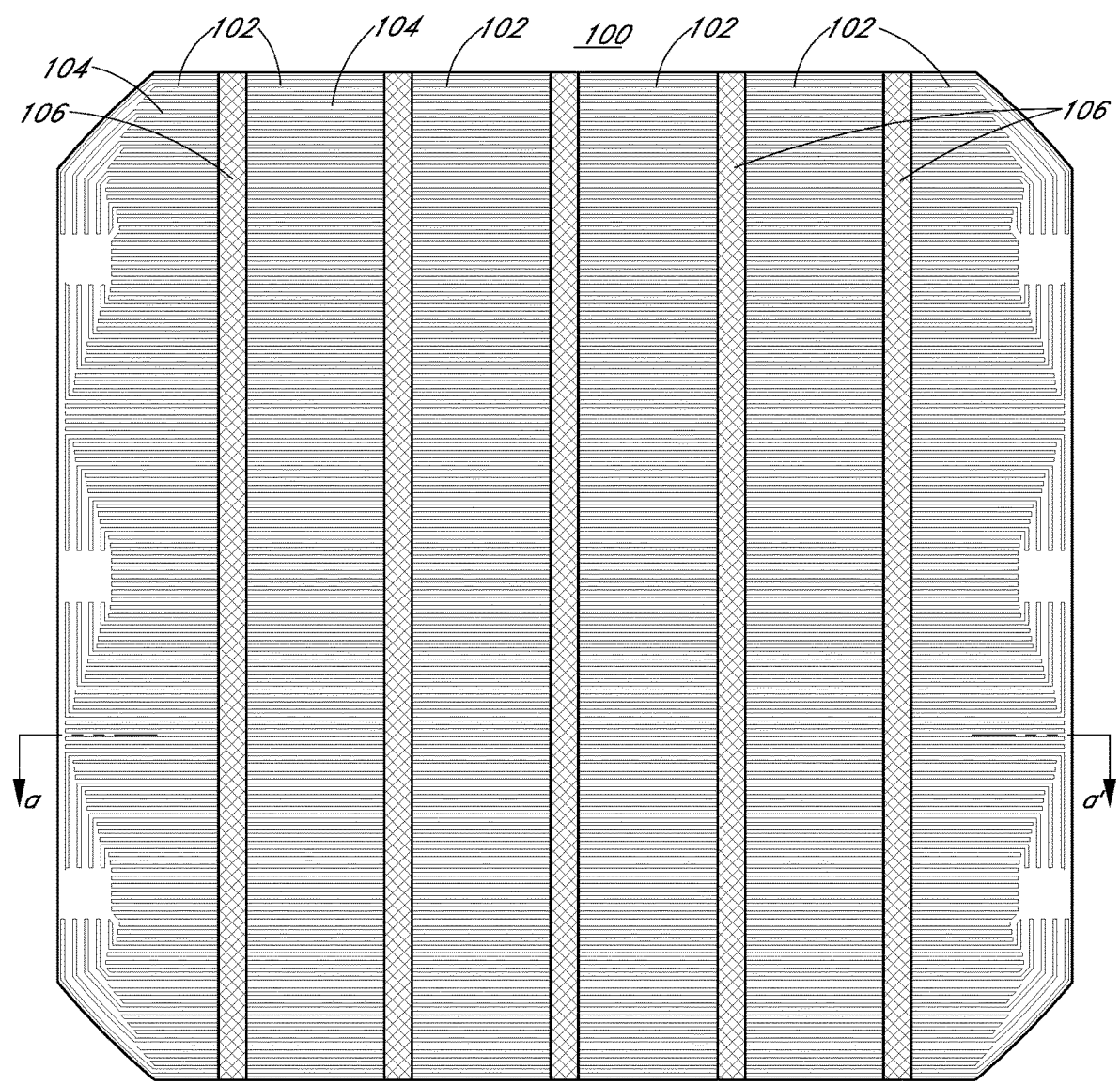
FIG. 1 illustrates a plan view and corresponding cross-sectional view taken along the a-a' axis of a solar cell having a plurality of sub-cells coupled by cell level interconnection, in accordance with an embodiment of the present disclosure.
Figure 1:
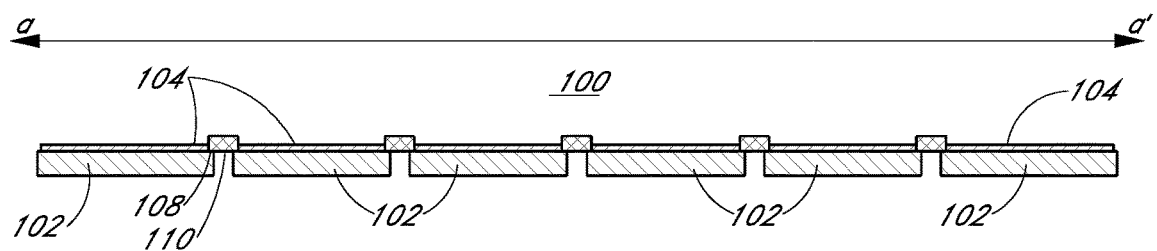

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

Methods of fabricating solar cells having a plurality of sub-cells coupled by cell level interconnection, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a plurality of sub-cells. Each of the plurality of sub-cells includes a singulated and physically separated semiconductor substrate portion. Each of the plurality of sub-cells includes an on-sub-cell metallization structure interconnecting emitter regions of the sub-cell. An inter-sub-cell metallization structure couples adjacent ones of the plurality of sub-cells. The inter-sub-cell metallization structure is different in composition from the on-sub-cell metallization structure.

Also disclosed herein are methods of fabricating solar cells. In one embodiment, a method of fabricating a solar cell includes forming a plurality of regions of a solder paste layer along a plurality of scribe regions of a semiconductor substrate. The method also includes, subsequent to forming the plurality of regions of the solder paste layer, scribing the semiconductor substrate along the plurality of scribe regions of the semiconductor substrate to form a plurality of sub-cells each including a singulated and physically separated semiconductor substrate portion. The method also includes coupling adjacent ones of the plurality of sub-cells with a corresponding metal ribbon coupled to the solder paste layer at adjacent outer perimeters of corresponding adjacent ones of the plurality of sub-cells.

In another embodiment, a method of fabricating a solar cell includes scribing a semiconductor substrate along a plurality of scribe regions of the semiconductor substrate to form a plurality of sub-cells each including a singulated and physically separated semiconductor substrate portion. The method also includes, subsequent to scribing the semiconductor substrate, forming a plurality of regions of a solder paste layer at adjacent outer perimeters of corresponding adjacent ones of the plurality of sub-cells. The method also includes coupling adjacent ones of the plurality of sub-cells with a corresponding metal ribbon coupled to the solder paste layer.

One or more embodiments described herein are directed to the fabrication of high voltage panels, which can potentially save cost in micro-inverter requirements. Approaches described below may be implemented to provide process and cost efficient cell level metallization for small diced cells for high voltage modules.

To provide context, potential issues exist in the fabrication of cells for high voltage panels. One such issue involves metal breakages in thin metal bridges between small cells. Another such issue involves dark area formation which may occur with conventional soldering and tabbing. Additionally, high voltage panels need small cells to generate high voltage and low current. Small cells have advantage in low current such that they can use thinner metal fingers avoiding thick plated metal. However, the number of interconnection between the cells increases so that interconnection should be strong enough not to be broken under certain stress in a module. Accordingly, thick interconnection may be necessary. Furthermore, the bowing of diced cells may occur due to more soldering required per finger length.

In order to address above issues, one or more embodiments described herein involve implementation of one or more of (1) simpler sub-cell metallization through the use of minimal plating or no plating which is accessible with small finger lengths and low current, (2) forming the sub-cell interconnection with screen printable solder paste to reduce dark area formation, and (3) the use of relatively thick conductive ribbons to provide sufficient strength against metal breakages. In one embodiment, cells are metallized only by seed by sputtering or evaporation without using plating or the use of very short plating to make thin metal fingers such as less than 10 microns. In one embodiment, interconnection is made by ribbons placed on screen printable solder paste and soldered by reflow.

More generally, embodiments are directed to the use of metallization as a handle to enable dicing or singulation of solar cell wafers without increasing module interconnections or requiring handling of smaller cells. In an exemplary embodiment, a single solar cell (e.g., 125 cm, 156 cm, 210 cm) is subdivided into smaller cells to allow for flexibility in module current and voltage, as well as flexibility in the metallization. As an example, a single silicon P/N diode has an open circuit voltage (Voc) of 0.6 to 0.8 V. A maximum power voltage (Vmp) may be approximately 0.63V for a solar cell. Thus, single diode cells will have a voltage of 0.63V. If 10 sub-diodes are produced on a single full-area wafer, and connected in series, the voltage would be 6.3V for the entire cell (at roughly $\frac{1}{10}^{th}$ the current, or about 0.5 A for a standard cell). An application for a cell of such a voltage range may be USB charging specification 1.2. If 96 cells of this voltage were to be arranged in series in a module, the module operating voltage would be approximately 604.8V DC. An application for a module with such a voltage range is for simplifying the power electronics inside inverters that make the voltage conversion from low volt DC to high volt (approximately 240 Vrms) AC applications.

Having the ability to control the voltage conversely allows control over the current, which ultimately dictates the thickness of the metal required for a finished device, since power loss is associated with resistive losses in the metal. For example, for an interdigitated back contact (IBC) cell on a 5 inch wafer, the nominal finger length is 125 mm long, and requires approximately 30 microns of plated copper (Cu) to prevent grid losses. Moving to a 6 inch wafer extends the finger length to 156 millimeters, and since resistive losses go by the length squared, this may require a metal thickness of approximately 48 microns. The potential adds substantial cost to metallization, e.g., by having more direct material costs and by reducing the throughput of the tools. Thus, the ability to control the finger length and cell parametrics by moving to multiple diode solutions can allow for greater flexibility in the processing of solar cell metallization. In particular, for applications on larger cells, increasing the size of the cell also produces more current. Additionally, temperature of the devices in operation in the field is dependent on the current and generally should be minimized to avoid accelerated aging affects, and risks of higher temperatures should cells enter reverse bias. Furthermore, in general, lower current will improve the overall reliability of the module.

To provide context, when moving toward solar cell fabrication using larger wafers having a single diode formed on the wafer, a larger current is generated. Such increased current typically requires thicker metal to avoid Rs losses, which can add cost and complexity to a manufactured solar cell. A state-of-the-art industry solution involves dicing of the cells into smaller individual diodes, e.g., 2, 4, 16, etc., such that the current is reduced both by smaller area, as well as by shorter current transport lengths along the contact fingers. However, two issues often arise when implementing this approach. First, individual components are generated, in that each sub-cell needs to be handled and interconnected. Accordingly, an increased number of cell-to-cell interconnects are required, and handling of different sized, smaller wafers within the cell is needed. Second, sub-components are sometimes generated on a template (e.g., a backplane), which ties the sub-cells together. One issue associated with such an approach is the cost of the backplane, and the complexity of bonding through the backplane. Furthermore, for optimal performance of the system, the current of each sub-cell should be matched, which provides a complication for pseudo-square single crystalline wafers due to the various axes of symmetry, as well as 'dead' spaces on cells from, e.g., plating or testing pads, or interconnections pads. This provides some geometric constraints. Additionally, where the metal is required to physically hold the sub-cell assembly together without shunting to neighboring sub-cells, this provides some challenges, e.g., for in-series ¼ cell designs require novel emitter and metal configurations to hold the cell together without individual component handling.

As an exemplary structure, FIG. 1 illustrates a plan view and corresponding cross-sectional view taken along the a-a' axis of a solar cell having a plurality of sub-cells coupled by cell level interconnection, in accordance with an embodiment of the present disclosure.

Referring to FIG. 1, a solar cell 100 includes a plurality of sub-cells 102. Each of the plurality of sub-cells 102 is a singulated and physically separated semiconductor substrate portion. Each of the plurality of sub-cells 102 includes an on-sub-cell metallization structure 104 interconnecting emitter regions of the sub-cell 102. An inter-sub-cell metallization structure 106 couples adjacent ones of the plurality of sub-cells 102. In an embodiment, the inter-sub-cell metallization structure 106 is different in composition from the on-sub-cell metallization structure 104.

In an embodiment, the inter-sub-cell metallization structure 106 for the solar cell 100 is a plurality of metal ribbons 106 coupling corresponding adjacent ones of the plurality of sub-cells 102, as is depicted. In one such embodiment, the plurality of metal ribbons 106 is disposed on a solder paste layer disposed at adjacent outer perimeters 108 of the corresponding adjacent ones of the plurality of sub-cells 102. In a specific such embodiment, the solder paste layer is essentially confined to the adjacent outer perimeters 108 of the corresponding adjacent ones of the plurality of sub-cells 102. In another specific embodiment, the solder paste layer further extends across at least a portion of a region 110 of the metal ribbon 106 between but not in contact with adjacent sub-cells 102. In an embodiment, the locations of solder paste placement are regions that limit dark areas of the cell or sub-cells.

In an embodiment, each of the plurality of metal ribbons 106 has a thickness suitable to avoid breakage during handling yet to allow ease of handling and coupling to sub-cells. In one embodiment, each of the plurality of metal ribbons 106 has a thickness approximately in the range of 50-300 microns. In an embodiment, each of the ribbons 106 includes one or more holes along an approximate center of the ribbon. In one such embodiment, the one or more holes are a stress relief feature in the ribbon.

In an embodiment, each metal ribbon is an aluminum (Al) foil portion. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated).

In an embodiment, the solder paste is composed of a solvent and aluminum/silicon (Al/Si) alloy particles. In an embodiment, the solder paste is a screen printable solder paste, the use of which can reduce dark areas in sub-cells. For example, alignment tolerance can be similar to other screen print operations, such as approximately 100-200 microns, and does not suffer from dispensing alignment. In an embodiment, the solder paste has a thickness approximately in the range of 0.1-5 microns. In another embodiment, as an alternative to a solder paste, an electrically conductive adhesive (ECA) can be used but likely with greater associated expense. In one embodiment, in order to avoid spreading of solder or ECA causing shunting, (a) a print solder mask based on polyimide or high temperature mask materials is used together with solder balls instead of screen printable solder paste, or (b) pressure and temperature parameters are selected to cause the solder paste to shrink by surface tension.

In an embodiment, the on-sub-cell metallization structure 104 includes a metal seed layer. In one such embodiment, the metal seed layer is formed on exposed portions of alternating N-type and P-type emitter regions. In a specific such embodiment, a mask is first formed to expose only select portions of the N-type and P-type emitter regions in order to direct metal seed layer formation to restricted locations. In an embodiment, the on-sub-cell metallization structure 104 consists only of, or essentially only of, a metal seed layer.

In an embodiment, an aluminum-based metal seed layer is used as a metal seed layer for on-sub-cell metallization structure 104. In one embodiment, the metal seed layer is a layer having a thickness approximately in the range of 0.1 to 20 microns and includes aluminum in an amount greater than approximately 90 atomic %. In a specific embodiment, the metal seed layer is deposited as a blanket layer which is later patterned, e.g., using a deposition, lithographic, and etch approach. In another specific embodiment, the metal seed layer is deposited as a patterned layer. In one such embodiment, the patterned metal seed layer is deposited by printing the patterned metal seed layer.

Although a metal seed-only approach can avoid plating processing for cells since the thin metal seed can conduct low current (e.g., less than 1 A), in another embodiment, on-sub-cell metallization structure 104 formation further includes forming a metal layer by plating on the metal seed layer to form conductive contacts for the N-type and P-type emitter regions. Accordingly, in an embodiment, the on-sub-cell metallization structure 104 is formed by first forming a metal seed layer and then performing an electroplating process. In one such embodiment, the plated metal layer is a copper layer.

Although other example arrangements are contemplated, in an embodiment, each of the sub-cells 102 has approximately a same voltage characteristic and approximately a same current characteristic as one another. In an embodiment, the plurality of sub-cells 102 is a plurality of in-series diodes. In another embodiment, the plurality of sub-cells 102 is a plurality of in-parallel diodes.

In an embodiment, each metal ribbon 106 extends across but not in between gaps between adjacent sub-cells 102, as is depicted in the cross-sectional view of FIG. 1. In another embodiment, each metal ribbon 106 extends across and in between gaps between adjacent sub-cells 102. As an exemplary structure, FIG. 2 illustrates a cross-sectional view another solar cell having a plurality of sub-cells coupled by cell level interconnection, in accordance with another embodiment of the present disclosure.

Figure 2:
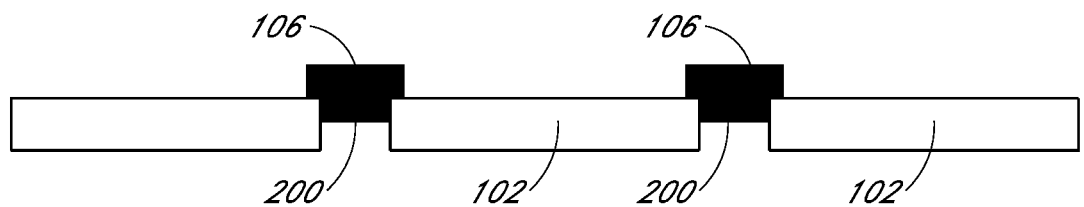
FIG. 2 illustrates a cross-sectional view another solar cell having a plurality of sub-cells coupled by cell level interconnection, in accordance with another embodiment of the present disclosure.

Referring to FIG. 2, a plurality of sub-cells 102 is coupled together by an inter-sub-cell metallization structure 106 coupling adjacent ones of the plurality of sub-cells 102. Each of the plurality of metal ribbons 106 includes an intervening tab 200 extending between corresponding adjacent ones of the plurality of sub-cells 102. In one embodiment, each of the plurality of metal ribbons 106 including the intervening tab 200 is a unitary body.

The use of intervening tabs can inhibit movement and ultimate contact of adjacent sub-cells in a solar cell. In one embodiment, the intervening tabs remains as a final artifact of a completed solar cell. In another embodiment, intervening tabs are removed in the process of fabricating a solar cell. As an example, FIGS. 3A and 3B illustrate cross-sectional views of solar cells having a plurality of sub-cells coupled by cell level interconnection, in accordance with another embodiment of the present disclosure.

Figure 3A:
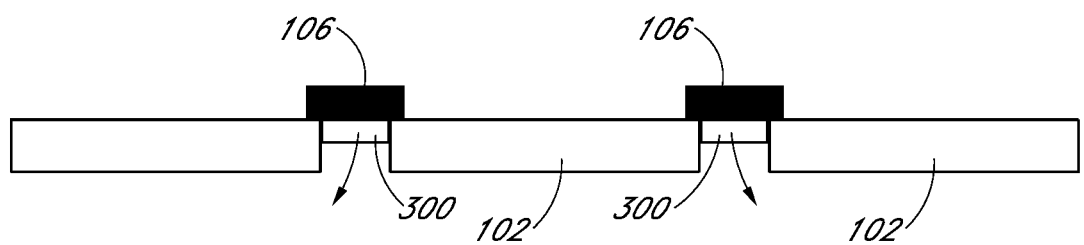
FIGS. 3A and 3B illustrate cross-sectional views of solar cells having a plurality of sub-cells coupled by cell level interconnection, in accordance with another embodiment of the present disclosure.
Figure 3B:
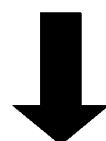
Figure 3B:
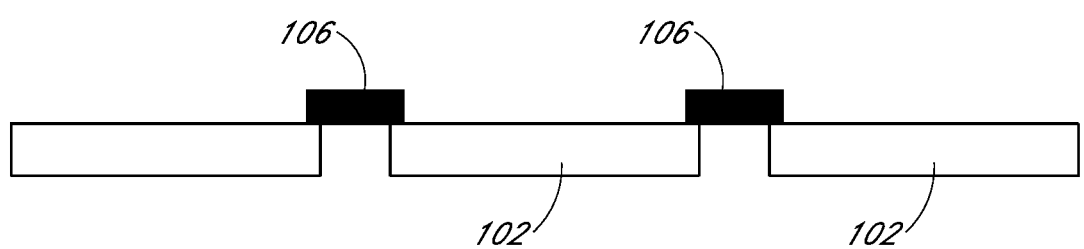

Referring to FIG. 3A, a plurality of sub-cells 102 is coupled together by an inter-sub-cell metallization structure 106 coupling adjacent ones of the plurality of sub-cells 102. Each of the plurality of metal ribbons 106 includes an intervening tab 300 extending between corresponding adjacent ones of the plurality of sub-cells 102. In one embodiment, the intervening tabs 300 are composed of a different material than, or are separable from, each of the plurality of metal ribbons 106. In one such embodiment, the intervening tabs 300 are removable intervening tabs. Referring to FIG. 3B, in accordance with an embodiment of the present disclosure, the intervening tabs 300 are removed from the finalized solar cell, e.g., after a curing process following ribbon attachment.

Figure 4:
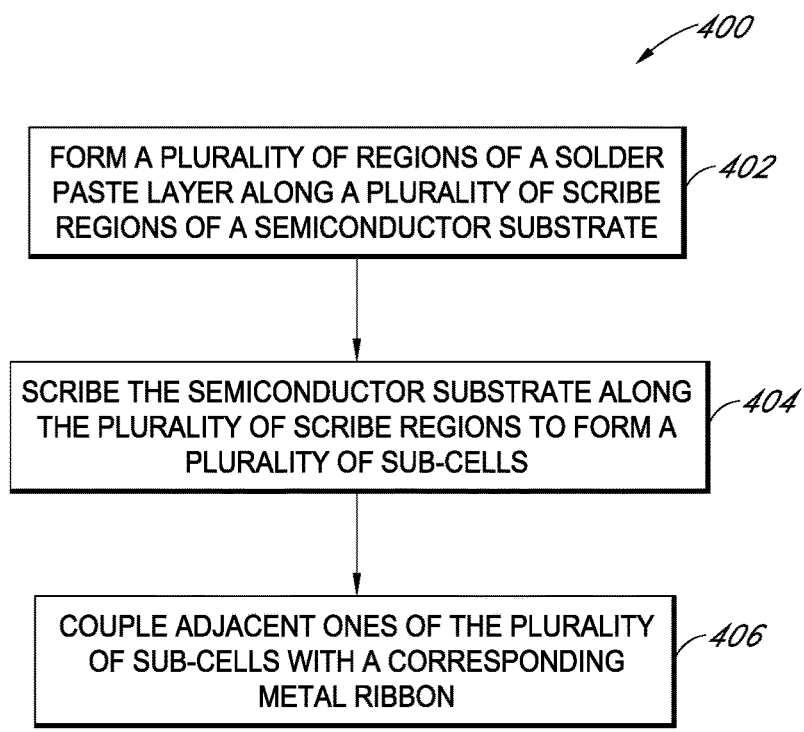
FIG. 4 is a flowchart representing operations in a method of fabricating a solar cell using singulation to form sub-cells, in accordance with an embodiment of the present disclosure.
Figure 5A:
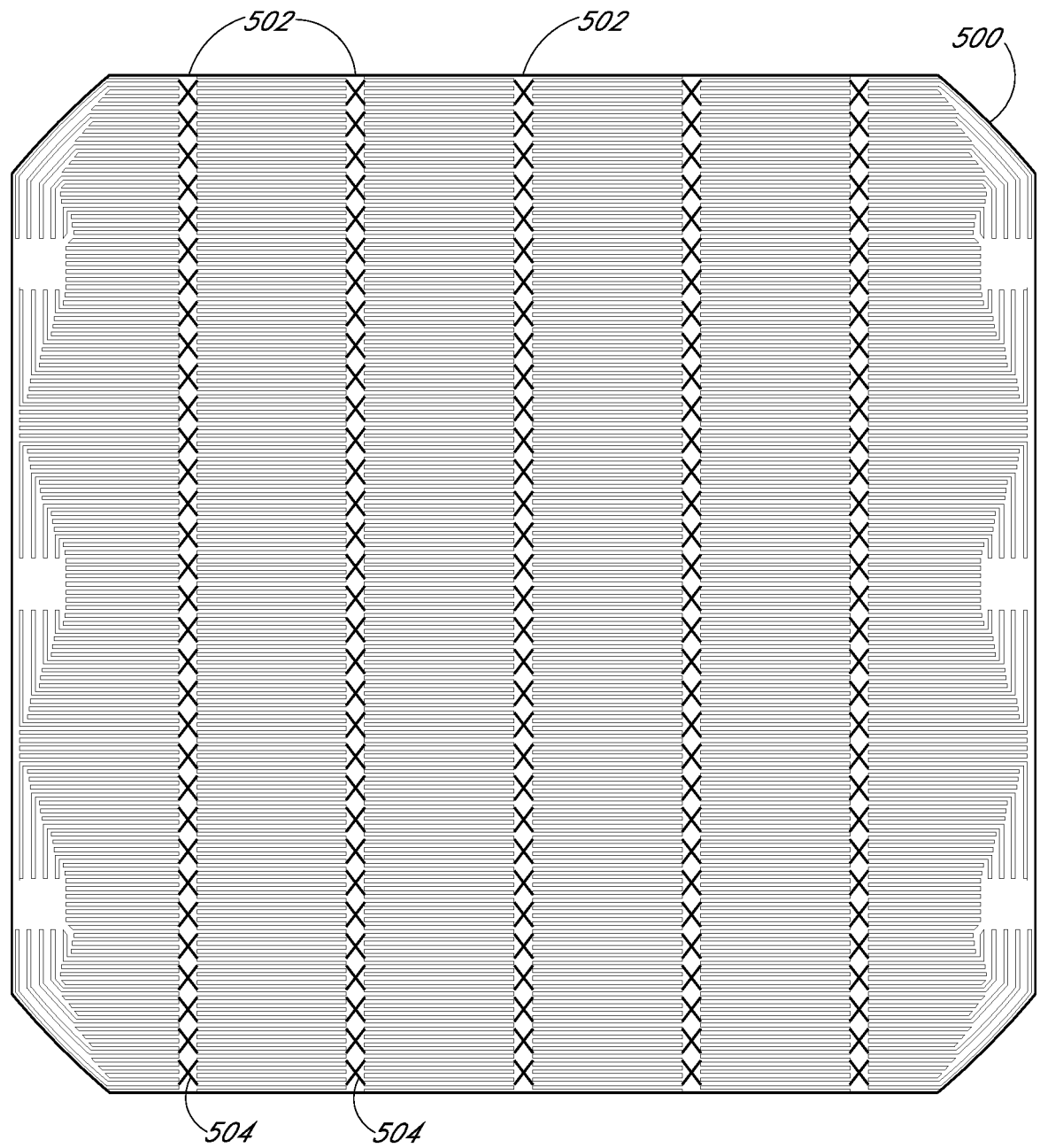
FIGS. 5A and 5B illustrate cross-sectional views of various operations in a method of fabricating a solar cell having a plurality of sub-cells coupled by cell level interconnection, corresponding to the operations of the flowchart of FIG. 4, in accordance with an embodiment of the present disclosure.
Figure 5B:
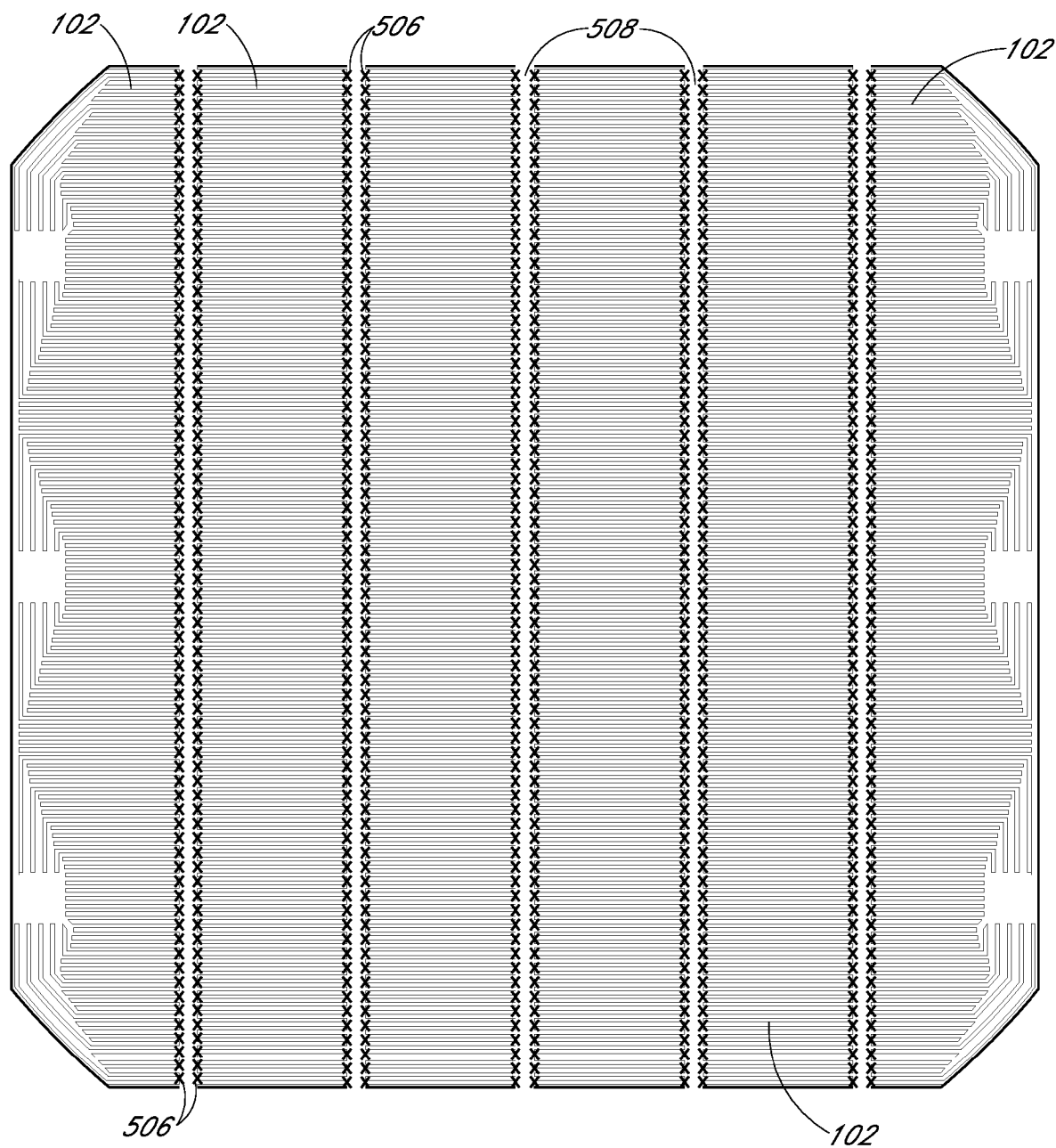

In a first exemplary processing scheme, FIG. 4 is a flowchart 400 representing operations in a method of fabricating a solar cell using singulation to form sub-cells, in accordance with an embodiment of the present disclosure. FIGS. 5A and 5B illustrate cross-sectional views of various operations in a method of fabricating a solar cell having a plurality of sub-cells coupled by cell level interconnection, corresponding to the operations of the flowchart of FIG. 4, in accordance with another embodiment of the present disclosure.

Referring to operation 402 of the flowchart 400 of FIG. 4, and corresponding to FIG. 5A, a method of fabricating a solar cell includes first forming a plurality of regions of a solder paste layer 504 along a plurality of scribe regions 502 of a semiconductor substrate 500. In an exemplary embodiment, the substrate 500 has five scribe lines 502 separating the substrate 500 into six approximately equal portions, which will ultimately provide six approximately equal sub-cells, as is depicted.

Referring to operation 404 of the flowchart 400 of FIG. 4, and corresponding to FIG. 5B, subsequent to forming the plurality of regions of the solder paste layer 504, the semiconductor substrate 500 is scribed along the plurality of scribe regions 502 to form a plurality of sub-cells 102. Each sub-cell 102 includes a singulated and physically separated 508 portion of the semiconductor substrate 500. The singulation leaves remaining solder paste 506 at adjacent outer perimeters of corresponding adjacent ones of the plurality of sub-cells 102.

Referring to operation 406 of the flowchart 400 of FIG. 4, and corresponding to FIG. 1, adjacent ones of the plurality of sub-cells 102 are coupled with a corresponding metal ribbon 106 coupled to the remaining solder paste 506 at adjacent outer perimeters of corresponding adjacent ones of the plurality of sub-cells 102. In an embodiment, the metal ribbon 106 is soldered to the plurality of sub-cells 102 by reflow in an infra-red (IR) oven or by using heat coils. In an embodiment, since the solder paste is applied prior to singulation, solder paste is located at region 108 but not at region 110 of the metal ribbon 106 of the structure of FIG. 1.

Figure 6:
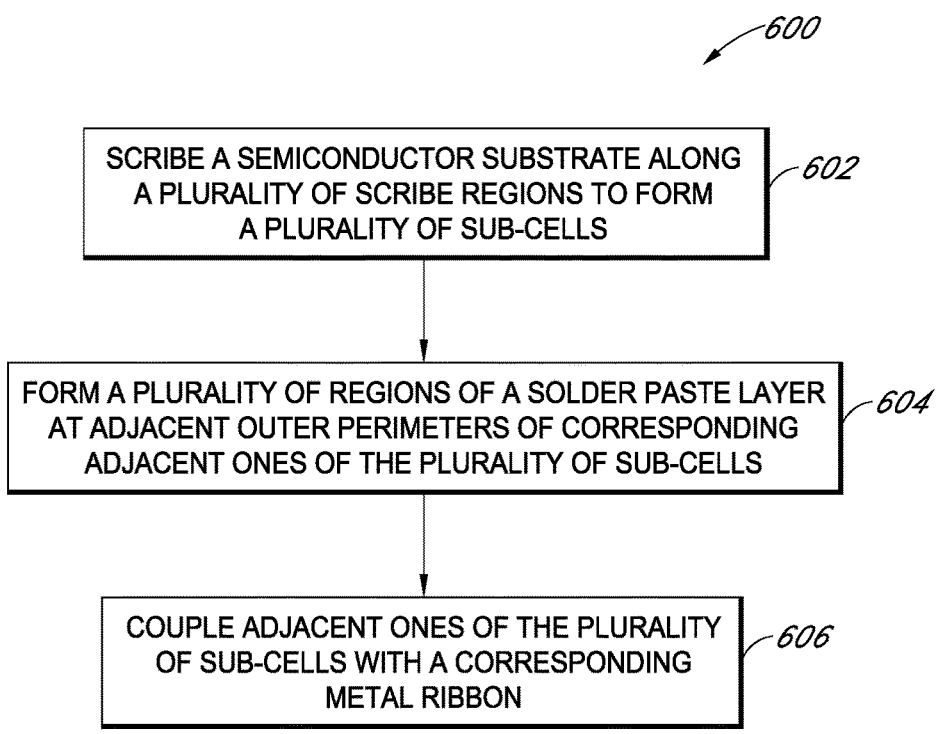
FIG. 6 is a flowchart representing operations in another method of fabricating a solar cell using singulation to form sub-cells, in accordance with another embodiment of the present disclosure.
Figure 7A:
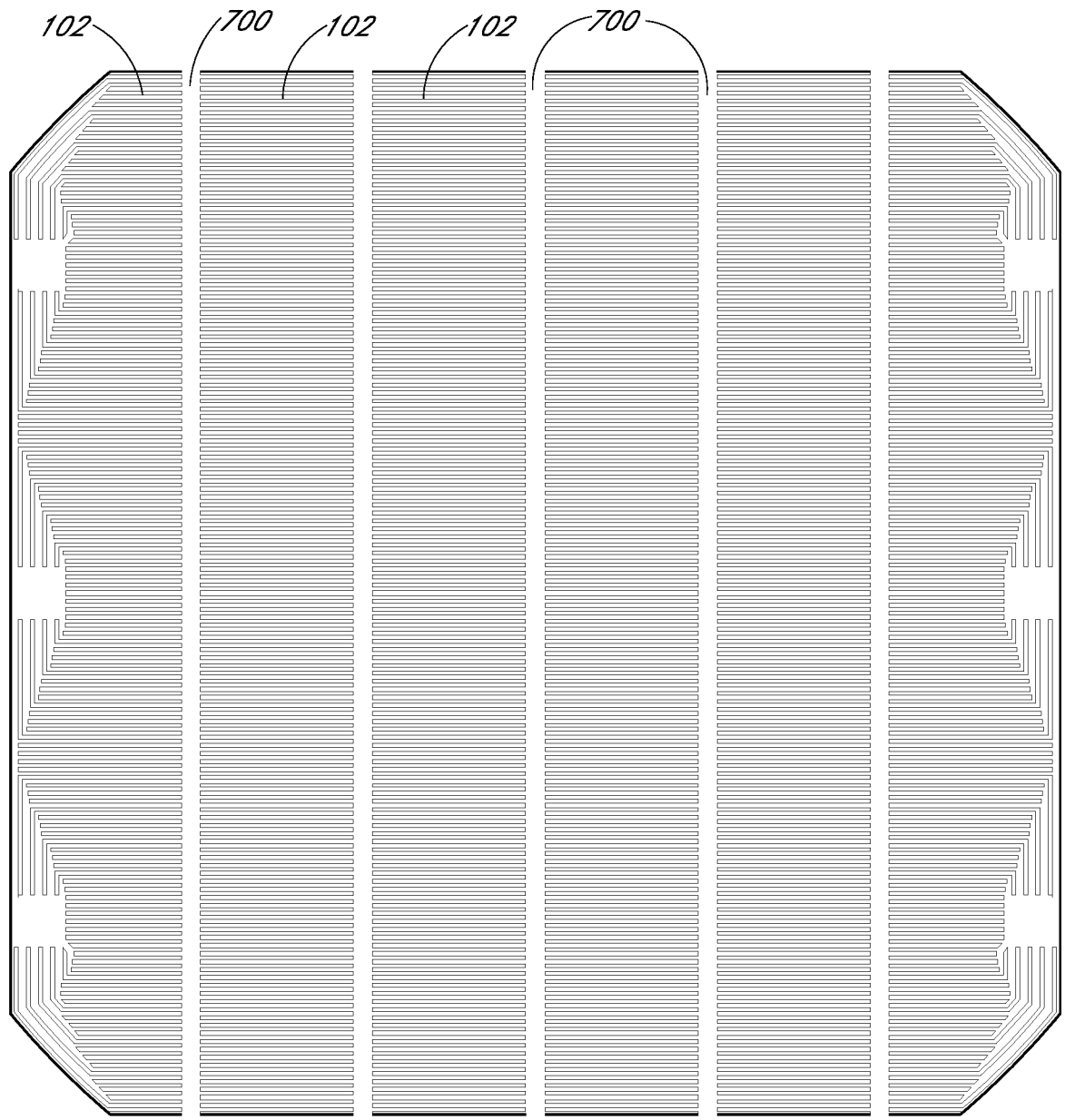
FIGS. 7A and 7B illustrate cross-sectional views of various operations in a method of fabricating a solar cell having a plurality of sub-cells coupled by cell level interconnection, corresponding to the operations of the flowchart of FIG. 6, in accordance with another embodiment of the present disclosure.
Figure 7B:
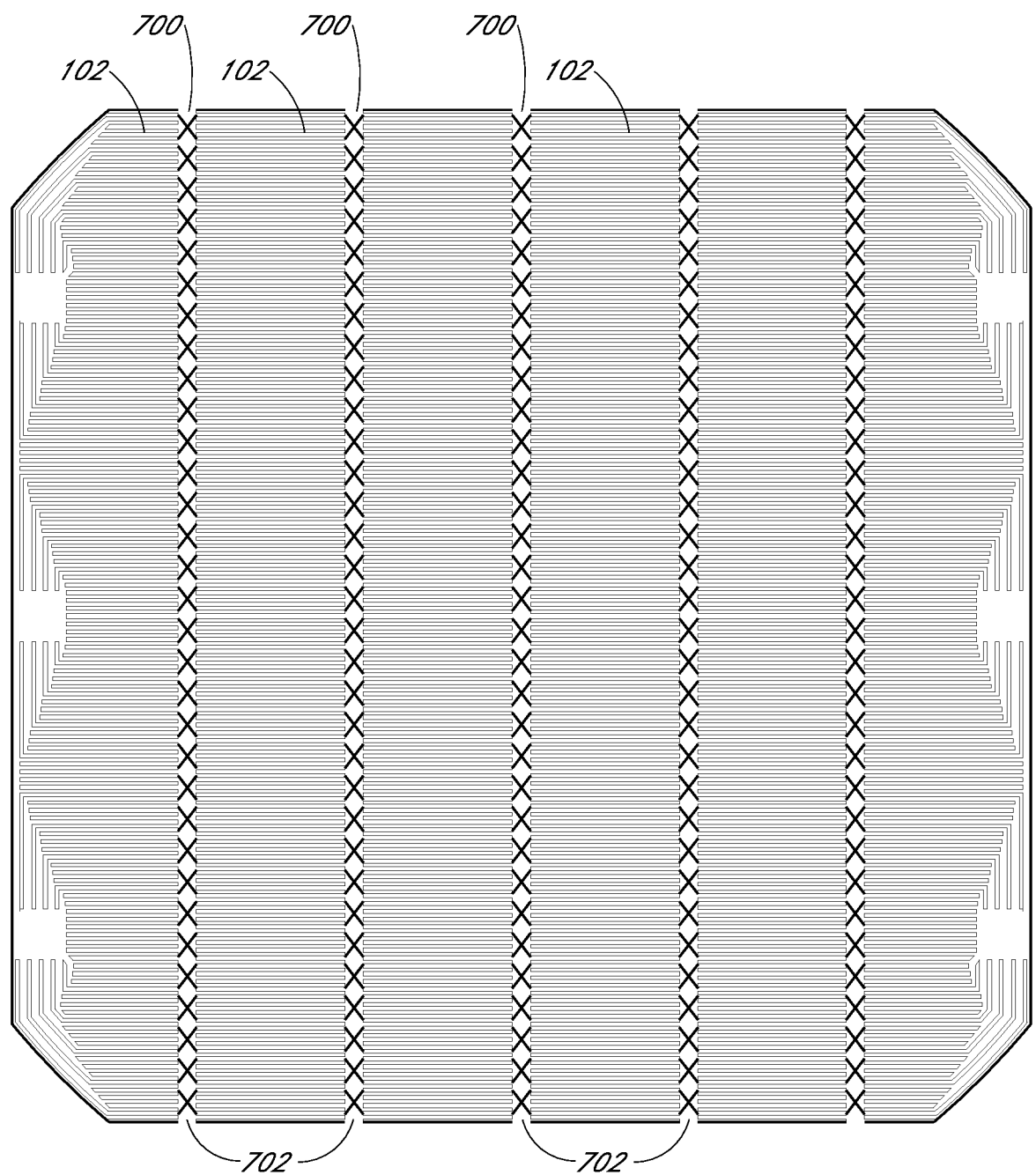

In a second exemplary processing scheme, FIG. 6 is a flowchart 600 representing operations in another method of fabricating a solar cell using singulation to form sub-cells, in accordance with another embodiment of the present disclosure. FIGS. 7A and 7B illustrate cross-sectional views of various operations in a method of fabricating a solar cell having a plurality of sub-cells coupled by cell level interconnection, corresponding to the operations of the flowchart of FIG. 6, in accordance with another embodiment of the present disclosure.

Referring to operation 602 of the flowchart 600 of FIG. 6, and corresponding to FIG. 7A, a method of fabricating a solar cell includes first scribing a semiconductor substrate along a plurality of scribe regions 700 of the semiconductor substrate to form a plurality of sub-cells 102 each including a singulated and physically separated semiconductor substrate portion.

Referring to operation 604 of the flowchart 600 of FIG. 6, and corresponding to FIG. 7B, subsequent to scribing the semiconductor substrate, a plurality of regions of a solder paste layer 702 are formed at adjacent outer perimeters of corresponding adjacent ones of the plurality of sub-cells 102.

Referring to operation 606 of the flowchart 600 of FIG. 6, and corresponding to FIG. 1, adjacent ones of the plurality of sub-cells 102 are coupled with a corresponding metal ribbon 106 coupled to the solder paste layer 702. In an embodiment, the metal ribbon 106 is soldered to the plurality of sub-cells 102 by reflow in an infra-red (IR) oven or by using heat coils.

In an embodiment, the solder paste layer 702 is applied to the sub-cells 102 prior to coupling the metal ribbons 106 to the sub-cells 106. In one such embodiment, solder paste is ultimately located at region 108 but not at region 110 of the metal ribbon 106 of the structure of FIG. 1. In another embodiment, the solder paste layer 702 is applied to the metal ribbons 106 which in turn are then coupled to the sub-cells 106. In one such embodiment, solder paste is ultimately located at region 108 and at region 110 of the metal ribbon 106 of the structure of FIG. 1.

In an embodiment, dicing or singulation is performed using a mechanical approach, a laser approach, or both a laser and mechanical approach. In an embodiment, the dicing or singulation is performed prior to ribbon attachment, as described above. It is to be appreciated that dicing before ribbon attachment can have an advantage of avoiding substrate shunting issues. However, in other embodiments, the dicing or singulation is performed after ribbon attachment.

In an embodiment, a laser scribing process is used to partially or completely singulate a solar cell. In one embodiment, singulation is implemented to take advantage of crack-tolerant properties of standard silicon substrate based cells as a design feature. In one such embodiment, a standard size cell is plated with a select number of sub-diode partitions and a deliberate crack is introduced. For example, a scribe plus break approach can be applied where (i) the substrate is partially scribed (e.g., approximately 70% depth) and then (ii) cracked along the break to terminate at the metallization structure. In another embodiment, a laser scribe-only approach is implemented. In any such dicing or singulation processes, a pico-second laser ablation process can be used to provide a relatively clean scribing process, lower recombination, and narrower scribe width. Another option includes a nano-second or longer laser having wider scribe lines and higher throughput but may be associated with increased recombination and potential for debris.

Figure 8:
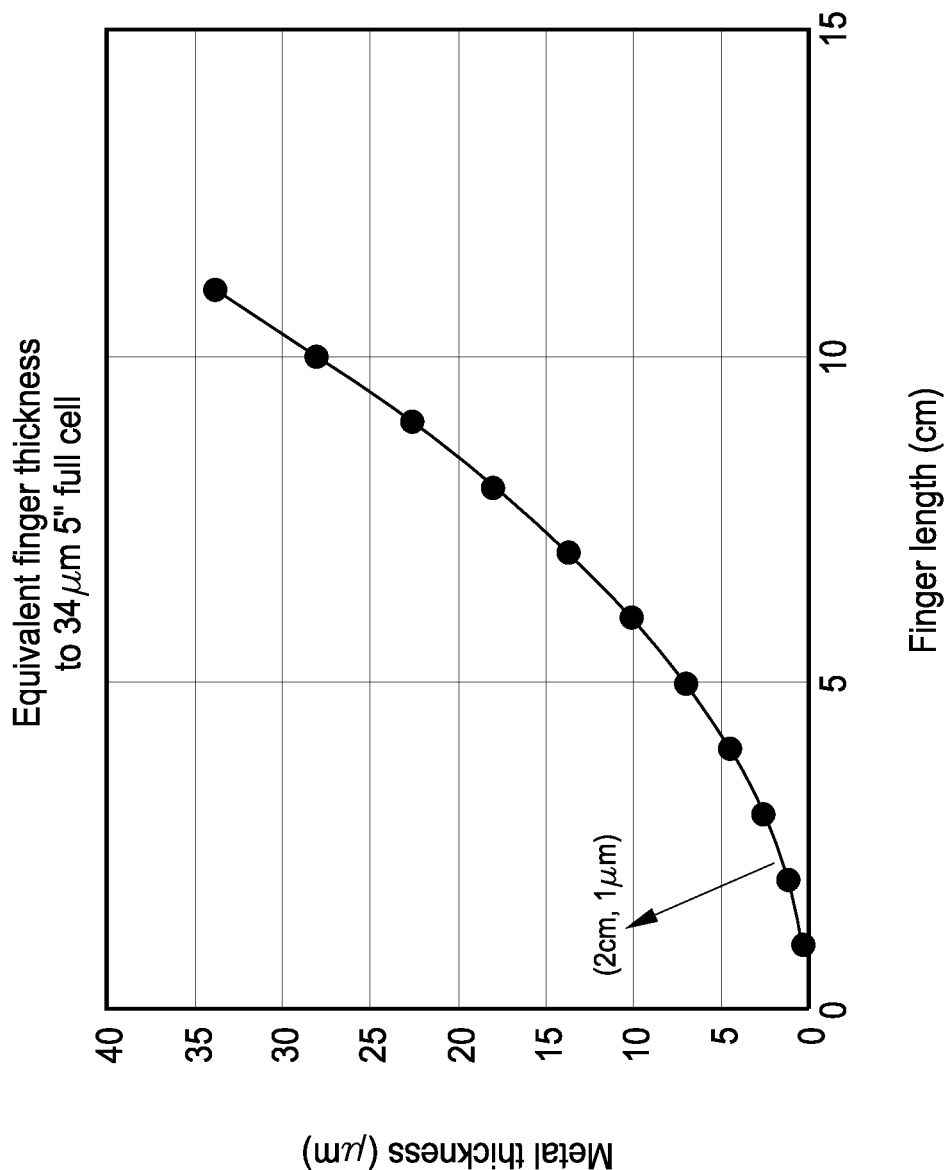
FIG. 8 is a plot of metal thickness (in microns) as a function of finger length (in cm) for a diced cell having metal seed on-cell metallization and metal ribbon inter-sub-cell metallization, in accordance with an embodiment of the present disclosure.

In an embodiment, implementing one or more of the described approaches can ultimately provide a high voltage panel with reliability in a cost effective manner. A high voltage panel integrated with a micro-inverter with reduced cost may highly impact, e.g., the residential market. To demonstrate the effectiveness of approaches described above, FIG. 8 is a plot of metal thickness (in microns) as a function of finger length (in cm) for a diced cell having metal seed on-cell metallization and metal ribbon inter-subcell metallization, in accordance with an embodiment of the present disclosure. The plot of FIG. 8 shows equivalent finger thickness to a 34 μm, 5 inch full cell. As demonstrated in the plot of FIG. 8, and in accordance with one or more embodiments, small cells have advantage in low current such that they can use thinner metal fingers avoiding thick plated metal.

In yet additional embodiments, approaches are described for addressing the risk of power loss from diced cells. In an exemplary embodiment, approaches for reducing the edge losses are implemented. In one such embodiment, pre-grooving is performed prior to texturizing a light-receiving surface of the solar cell. This is followed by a break process and, possibly, a post-isolation passivation process. In one such embodiment, the emitter is designed so that the scribe falls primarily or entirely within the N-doped region, which has a lower recombination rate when unpassivated than the unpassivated P-doped region, and therefore results in significantly less power loss. In another embodiment, the emitter and scribe are designed so that there is little or no intersection of the scribe with a P-N junction, since unpassivated junctions have significantly higher recombination resulting in more power loss. Furthermore, in an embodiment, with the understanding that certain laser parameters may result in side-wall damage, melting, and disruption of the insulating dielectric stack on the rear side, the laser parameters are selected so as to minimize such damage, melting, and disruption. Typically, this drives a laser selection to shorter pulse-lengths (e.g., less than approximately 10 nanoseconds), and processes that stop short of disrupting the rear dielectric (e.g., groove followed by mechanical separation).

In accordance with embodiments described herein, exemplary layouts include half-cell, quarter-cell, 10-cell or 6-cell designs (the last design depicted in FIGS. 1, 5A, 5B, 7A and 7B). Some embodiments are directed to back contact solar cells, and some embodiments enable the fabrication of diced multi-diode cells with controllable voltage and current, modules with variable voltage and current, and the fabrication of relatively large cells.

It is to be appreciated that a variety of arrangements of numbers and electrically coupling of sub-cells within a singulated solar cell may be contemplated within the spirit and scope of embodiments described herein. In a first exemplary embodiment, a solar cell is diced into four sub-cells, where the individual sub-cells are ¼ current of a single diode full cell, and have the same voltage as the single diode cell, whereas the combined 4-diode full cell has the same current, same voltage as full-size single diode cell. In a second exemplary embodiment, a solar cell is diced into two sub-cells in a parallel arrangement, where the sub-cells are ½ current, same voltage sub-cells, with the combined full cell being same current, same voltage. In a third exemplary embodiment, a solar cell is diced into two sub-cells in a series arrangement, where the sub-cells are ½ current of a single diode full cell, with the same voltage, with the combined full cell being ½ the current, but twice voltage of a single diode cell of the same size. In a fourth exemplary embodiment, a solar cell is diced into six sub-cells in a series arrangement, as described above. In a fifth exemplary embodiment, a solar cell is diced into ten sub-cells in a series arrangement, where the voltage of the combined cell is 10× a single diode-cell of the same size, i.e., about 6.3 Vmp. The current in the combined cell is approximately $\frac{1}{10}^{th}$ the current of the original cell (e.g., about 0.5 A). Such as cell can be used directly to charge a USB for consumer charging applications, or if built in to a 96 cell module, can produce a module voltage of approximately 600V. The 10× reduction in current for this type of cell design can improve the reliability and safety through reduction in peak temperatures caused my resistive heating.

It is to be appreciated that other arrangements for sub-cells may also be achieved using approaches described herein, such as, but not limited to, 3×3, 4×4, etc., type arrangements. Also, a combination of series and parallel configurations of sub-cells within an original cell is also accessible. Approaches may be beneficial for both back contact and front contact based cells. Also, for AC power applications that require inverters, scaling the voltage to match the inverter output will save significantly on the inverter component costs, namely in the step-up power electronics required to go from the standard panel voltage (e.g., approximately 50V), up to a typical residential or commercial power need (approximately 240 Vrms AC).

In accordance with an embodiment of the present disclosure, each sub-cell of a diced solar cell has approximately a same voltage characteristic and approximately a same current characteristic. In an embodiment, the plurality of sub-cells is a plurality of in-parallel diodes, in-series diodes, or a combination thereof. In an embodiment, the solar cell and, hence, the sub-cell portions, is a back-contact solar cell, and the metallization structure is disposed on the back surface, opposite a light-receiving surface, of each of the singulated and physically separated semiconductor substrate portions. In one such embodiment, the back surface of each of the sub-cells has approximately a same surface area. In a particular embodiment, the light-receiving surface of each of the sub-cells is a texturized surface, as is described in greater detail below.

In accordance with an embodiment of the present disclosure, each of the singulated and physically separated semiconductor substrate portions is a bulk monocrystalline silicon substrate portion, such as fabricated from an N-type monocrystalline substrate. In one such embodiment, each silicon portion includes one or more N+ regions (e.g., phosphorous or arsenic doped regions) and one or more P+ regions (e.g., boron doped regions) formed in substrate itself. In other embodiments, each silicon portion includes one or more polycrystalline silicon N+ regions and one or more polycrystalline silicon P+ regions formed above a silicon substrate.

In an embodiment, the method of cell fabrication further involves texturizing the second surface (light-receiving surface) of the semiconductor substrate prior to scribing the semiconductor substrate. In one such embodiment, performing the operations in this order can mitigate dicing damage. In one such embodiment, a partial grooving of the wafer is first performed, and then any damage is removed during silicon etch process (e.g., texturing). However, in other embodiment, the scribing may be performed and then a subsequent wet etch is implemented. In any case, texturizing of the light-receiving surface of the solar cell can, in one embodiment, involve texturizing using a hydroxide-based etch process. It is to be appreciated that a texturized surface may be one which has a regular or an irregular shaped surface for scattering incoming light, decreasing the amount of light reflected off of the light-receiving surface of the solar cell. Additional embodiments can include formation of a passivation or anti-reflective coating layer on the light-receiving surface.

It is to be appreciated that a plurality of solar cells each singulated into sub-cells may be included in a photovoltaic (PV) module. In one such embodiment, for each solar cell, an encapsulating material of a laminate of the PV module is disposed in the groove between adjacent ones of the singulated and physically separated semiconductor substrate portions. That is, in one embodiment, subsequent to scribing the semiconductor substrate, the solar cells are embedded in a photovoltaic (PV) module laminate. An encapsulating material, e.g., ethylene vinyl alcohol (EVA) or poly-olefin, of the PV module laminate fills the groove between adjacent ones of the singulated and physically separated semiconductor substrate portions. In one such embodiment, the encapsulant provides shunt resistance as well as wear resistance between adjacent sub-cell portions. In one embodiment, the encapsulant material has a dielectric breakdown strength greater than approximately 1000 V/cm, such that the material adequately provides shunt protection between adjacent sub-cells. In one embodiment, as applied, the encapsulant has sufficiently low viscosity or high melt-flow to ensure that the encapsulant material flows into the thin groove resulting from singulation. Furthermore, cell-to-cell interconnection within the PV module may involve interconnection in series, in parallel, or a combination thereof.

One or more benefits or advantages of embodiments described herein can include enabling the use of larger wafers (e.g., 156 cm) without having to implement additional metal for solar cell fabrication. Embodiments can be implemented to enable scalable voltage and current designs, including high voltage designs, such as previously described for 5V USB applications, or 120/240 Vrms inverter applications. One or more embodiments involve use of a standard cell fabrication process without altering fab modules already in place for conventional cell fabrication. There may be no need for special handling or use of additional sub-cell interconnections. Power loss due to metal grid resistance can be reduced proportional to the square of the length of the metal grid finger. Finally, efficiency benefits may be achieved based on lower current and potentially more reliable cell fabrication.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. Additionally, although reference is made significantly to back contact solar cell arrangements, it is to be appreciated that approaches described herein may have application to front contact solar cells as well. In other embodiments, the above described approaches can be applicable to manufacturing of structures other than solar cells. For example, manufacturing of light emitting diode (LEDs) may benefit from approaches described herein.

Thus, methods of fabricating solar cells having a plurality of sub-cells coupled by cell level interconnection, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:

forming a plurality of regions of a solder paste layer along a plurality of scribe regions of a semiconductor substrate;

subsequent to forming the plurality of regions of the solder paste layer, scribing the semiconductor substrate along the plurality of scribe regions of the semiconductor substrate to form a plurality of sub-cells each comprising a singulated and physically separated semiconductor substrate portion;

coupling adjacent ones of the plurality of sub-cells with a corresponding metal ribbon coupled to the solder paste layer at adjacent outer perimeters of corresponding adjacent ones of the plurality of sub-cells, wherein coupling adjacent ones of the plurality of sub-cells with the corresponding metal ribbon comprises coupling adjacent ones of the plurality of sub-cells with a metal ribbon comprising an intervening tab extending between the corresponding adjacent ones of the plurality of sub-cells; and removing the intervening tab from the metal ribbon.

2. The method of claim 1, further comprising:

forming a completed on-sub-cell metallization structure by forming a metal seed layer on each of the plurality of sub-cells.

3. The method of claim 1, wherein scribing the semiconductor substrate along the plurality of scribe regions of the semiconductor substrate comprises performing a laser scribing process.

4. A method of fabricating a solar cell, the method comprising:

scribing a semiconductor substrate along a plurality of scribe regions of the semiconductor substrate to form a plurality of sub-cells each comprising a singulated and physically separated semiconductor substrate portion;

subsequent to scribing the semiconductor substrate, forming a plurality of regions of a solder paste layer at adjacent outer perimeters of corresponding adjacent ones of the plurality of sub-cells;

coupling adjacent ones of the plurality of sub-cells with a corresponding metal ribbon coupled to the solder paste layer, wherein coupling adjacent ones of the plurality of sub-cells with the corresponding metal ribbon comprises coupling adjacent ones of the plurality of sub-cells with a metal ribbon comprising an intervening tab extending between the corresponding adjacent ones of the plurality of sub-cells; and removing the intervening tab from the metal ribbon.

* * * * *

UNITED STATES PATENT AND TRADEMARK OFFICE
CERTIFICATE OF CORRECTION

| | | |
|---|---|---|
| PATENT NO. | : 11,824,130 B2 | Page 1 of 1 |
| APPLICATION NO. | : 17/966649 | |
| DATED | : November 21, 2023 | |
| INVENTOR(S) | : Rim et al. | |

It is certified that error appears in the above-identified patent and that said Letters Patent is hereby corrected as shown below:

On the Title Page

In the (71) Applicant field, delete "SunPower Corporation, San Jose, CA (US)" and insert -- Maxeon Solar Pte. Ltd., Singapore (SG) --.

Signed and Sealed this
Thirtieth Day of January, 2024

Katherine Kelly Vidal
*Director of the United States Patent and Trademark Office*